(12) United States Patent  
Tokushige

(10) Patent No.: US 7,115,950 B2  
(45) Date of Patent: Oct. 3, 2006

(54) SEMICONDUCTOR DEVICE AND METHOD OF MANUFACTURING THE SAME

(75) Inventor: Nobuaki Tokushige, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/184,847

(22) Filed: Jul. 20, 2005

(65) Prior Publication Data

US 2005/0253197 A1  Nov. 17, 2005

Related U.S. Application Data

(62) Division of application No. 09/660,926, filed on Sep. 13, 2000, now abandoned.

(30) Foreign Application Priority Data

Sep. 14, 1999 (JP) ................. 11-260738  
Sep. 28, 1999 (JP) ................. 11-274440  
Dec. 3, 1999 (JP) ................. 11-344933

(51) Int. Cl.  
*H01L 27/01* (2006.01)

(52) U.S. Cl. ...................... 257/351; 257/369
(58) Field of Classification Search ................ 257/347, 257/348, 350, 351, 369  
See application file for complete search history.

(56) References Cited

U.S. PATENT DOCUMENTS 5,557,231 A  9/1996  Yamaguchi et al.
6,043,536 A  3/2000  Numata et al.
6,072,217 A  6/2000  Burr
2005/0253197 A1*  11/2005  Tokushige .................. 257/347

FOREIGN PATENT DOCUMENTS

| JP | 8-32040 | 2/1996 |
| JP | 8-222705 | 8/1996 |
| JP | 10-125925 | 5/1998 |
| JP | 10-141487 | 5/1998 |
| KR | 96-12470 | 4/1996 |

OTHER PUBLICATIONS

U.S. Appl. No. 09/660,926, filed Sep. 13, 2000.  
A. Yoshino, et al., IEEE Intl. SOI Conference, Oct. 1995, "Highspeed Performance of 0.35 Mm CMOS Gates Fabriccated . . . ", p. 4.  
Copy of Korean Publication dated Apr. 30, 2002.

* cited by examiner

*Primary Examiner*—Mark V. Prenty  
(74) *Attorney, Agent, or Firm*—Nixon & Vanderhye P.C.

(57) ABSTRACT

A semiconductor device comprises; a MOS transistor formed on a semiconductor layer of an SOI substrate in which the semiconductor layer is formed on a semiconductor substrate with intervention of a buried insulating film, and a contact portion for applying to the semiconductor substrate different bias voltages in an operating state and a standby state of a semiconductor circuit including the MOS transistor.

8 Claims, 12 Drawing Sheets

SEMICONDUCTOR DEVICE AND METHOD OF MANUFACTURING THE SAME

This application is a Divisional of application Ser. No. 09/660,926, filed Sep. 13, 2000 now abandoned, the entire content of which is hereby incorporated herein by reference in this application.

BACKGROUND OF THE INVENTION

1. Field of the Invention

The present invention relates to a semiconductor device and a method of manufacturing the same. More particularly, it relates to a semiconductor device in which a MOS transistor is formed on an SOI substrate or a multilayer SOI substrate, and a method of manufacturing the semiconductor device.

2. Description of the Related Art

In recent years, the density of integration of a large-scale integrated circuit has been heightening rapidly. Consequently, the gate lengths of MOS transistors mounted in MOS type integrated circuits have become 0.2 µm or less at the level of practical use and have reached 0.05 µm at the level of researches. In order to realize a high performance and a long-term reliability in such micro MOS transistors, the structure of a MOS transistor must be optimized considering various factors.

In order to realize a still higher density of integration in a MOS type integrated circuit, the size of the whole MOS transistor must be made still smaller. Moreover, even when the size of the MOS transistor is made smaller, the gate length thereof needs to be shortened lest such a basic performance as current driving capability should degrade.

However, when the gate length is shortened, a phenomenon called "short channel effect" occurs conspicuously. Here, the "short channel effect" is the phenomenon that, as the gate length decreases, the threshold voltage and source/drain withstand voltage of the transistor lower and a subthreshold coefficient increases.

A method wherein the impurity concentration of a channel portion is increased with decrease in the gate length, is usually employed with the intention of suppressing such a short channel effect to incarnate a transistor of good characteristics.

However, when a micro MOS transistor is fabricated on the basis of such general principles, the capacitance of a pn junction formed between the drain of the MOS transistor and the substrate of the MOS type integrated circuit increases, and hence, a time period expended on the charge/discharge of a parasitic capacitance increases to lower the speed of a circuit operation.

Hitherto, micrifying transistors (optimizing the structures thereof) has been done while these difficult problems have been solved in well-balanced fashion. It is very difficult, however, to further micrify transistors and to heighten the density of integration of an integrated circuit by solving the problems of manufactural technology such as microfabrication techniques, design technology for an integrated circuit system as well as a complicated circuit, and so forth.

Meanwhile, a method wherein transistors are formed on an SOI substrate has been proposed.

In general, the transistors fabricated on the SOI substrate are structurally classified into the two types of "complete depletion type" and "partial depletion type". When the concentration of an impurity to be introduced into the silicon layer of a channel portion in NMOS/SOI or PMOS/SOI and the thickness of this silicon layer have been determined, the relationship in magnitude between the maximum value of the width of a depletion layer (the maximum depletion-layer width), which is predominated by the impurity concentration and the thickness of the silicon layer of the channel portion is determined. That is, the transistor in which the maximum depletion-layer width is larger than the thickness of the silicon layer of the channel portion is called "complete depletion type SOI transistor", while the transistor in which the maximum depletion-layer width is smaller than the thickness of the silicon layer of the channel portion is called "partial depletion type SOI transistor".

However, in a case where an integrated circuit employing the SOI substrate is operated with a very low voltage of, for example, 1 V or below, it involves the problem that a leakage current in a standby mode enlarges and that a consumption current increases in the standby mode.

In this regard, body contact SOI of four terminals has been proposed in order to solve the problem (for example, Japanese Patent Application Laid-open No. 10(1998)-141487).

As shown in FIG. 10 of the accompanying drawings, the body contact SOI is intended to dynamically change threshold voltages in such a way that a P-type well 82 and an N-type well 83, which are formed in the semiconductor layer 81 of an SOI substrate 80, are fully isolated by an element isolation region 84, and that the P-type well 82 and N-type well 83 are respectively controlled by bias voltages applied to well contacts 85 and 86.

With this method, however, the contact for affording an electric potential needs to be led out directly from the P-type well 82 of the semiconductor layer 81, and inevitably the semiconductor layer 81 needs to be thickened, so that a channel region becomes partially depleted. Moreover, since the contacts are led out directly from the wells of low impurity concentrations, well resistances are influential in relation to the distances between contact portions and transistors, and a substrate voltage is not uniformly applied, resulting in the problem that the threshold voltages become discrepant in the respective transistors contrariwise.

Proposed as another method is one wherein, as shown in FIG. 11, high-concentration impurity layers are formed in parts of the surface of a P-type silicon substrate which is a support substrate. More specifically, this method constructs a CMOS circuit wherein a high-concentration P-type region 89 is arranged in the vicinity of that interface between the support substrate 88 and a buried oxide film 87 which corresponds to the channel of an NMOS transistor, while an N-well 90 is arranged in the surface part of the support substrate 88 underlying a PMOS transistor, and a high-concentration N-type region 91 is disposed in the vicinity of that interface between the support substrate 88 and the buried oxide film 87 which corresponds to the channel of the PMOS transistor (refer to Japanese Patent Application Laid-open No. 8(1996)-32040, and Proceeding 1995 IEEE International SOI Conference 14p, October 1995).

In this semiconductor device, a depletion layer on the side of the support substrate 88 as is formed by the rise of a drain voltage can be restrained from spreading up to the lower parts of channel regions. Therefore, the parameters, such as threshold voltages and mobilities in channel, of the complete depletion type SOI transistors are stabilized, and the operating speed of the circuit can be raised.

In the semiconductor device, however, merely the N-well 90 is fixed at a supply voltage, and the threshold voltage of the transistor is not controlled by positively changing the voltage of the well. It is accordingly difficult to lower a leakage in a standby mode and a consequent consumption current in the standby mode.

Further, a semiconductor device wherein, as shown in each of FIGS. 12(a) to 12(d), a plus voltage or/and a minus voltage is/are directly applied to the back surface of a support substrate 92, thereby to control threshold voltages, has been proposed in Japanese Patent Application Laid-open No. 10(1998)-125925.

Since, however, an applied voltage to a well 93a or 93b is limited within the range of the reverse withstand voltage of a pn junction in the support substrate 92, the semiconductor device has the problem that the applied voltage is little versatile. Besides, a contact must be led out onto the side of a front-surface semiconductor layer in order to apply the voltage to the well, and this remains as a problem from the viewpoint of micrifying the semiconductor device. Further, it is not practical that, as shown in each of FIGS. 12(c) and 12(d), both the plus and minus voltages are applied directly to the support substrate 92 without forming any well. Moreover, the semiconductor device in each of FIGS. 12(a) to 12(d) consists in that a higher operating speed is attained by lowering the parasitic capacitance of SOI transistors, and that a body voltage is controlled so as to accumulate large numbers of carriers in the regions of the front-surface silicon layer underlying the body, thereby to control the threshold voltages and to suppress a floating body effect. That is, the semiconductor device is not intended to change a bias voltage between in the operating state and the standby state of a semiconductor circuit.

Also proposed is a structure wherein, as shown in FIG. 13, a threshold voltage is set low by employing a dual SOI structure which consists of a first insulating layer 94, a first semiconductor layer 95, a second insulating layer 96 and a second semiconductor layer 97 (refer to Japanese Patent Application Laid-open No. 8(1996)-222705).

In this semiconductor device, however, the back surface of the substrate is covered with an insulating film, no means is provided for controlling the threshold voltage, and merely a substrate bias effect is relieved to stabilize the threshold voltage. It is impossible to lower the leakage current of a transistor in the standby mode thereof and consequently the consumption current of the transistor in the standby mode thereof.

As thus far explained, even in the conventional semiconductor integrated circuit employing the SOI transistors, the parasitic capacitance have existed between the source/drain regions and the lower parts of the channel regions, and they have formed the cause for hindering the attainment of a higher operating speed. Besides, in the conventional SOI transistors, there has been known the method of controlling the threshold voltages and suppressing the floating body effect by controlling the body potential, but the method has had the problem that a satisfactory effect is not attained because of the various causes.

SUMMARY OF THE INVENTION

The present invention has been made in view of the above problems, and it has for its object to provide a semiconductor device which can cope with a still higher density of integration, which can lower a parasitic capacitance in an SOI transistor still further, which can attain a still higher operating speed by applying different bias voltages in the operating mode and standby mode of an SOI transistor, and in which threshold voltages can be controlled so as to satisfactorily accomplish the suppression of the floating body effect, and also a method of manufacturing the semiconductor device.

The present invention provides with a semiconductor device A comprising; a MOS transistor formed on a semiconductor layer of an SOI substrate in which the semiconductor layer is formed on a semiconductor substrate with intervention of a buried insulating film, and a contact portion for applying to the semiconductor substrate different bias voltages in an operating state and a standby state of a semiconductor circuit including the MOS transistor.

Further, the present invention provides with a semiconductor device B comprising a MOS transistor formed on a semiconductor layer of an SOI substrate in which the semiconductor layer is formed on a semiconductor substrate with intervention of a buried insulating film, an element isolating region formed in the semiconductor layer, and a contact region formed in the element isolating region for connection with a contact portion for applying a bias voltage to the semiconductor substrate.

Still further, the present invention provides with a semiconductor device C comprising a MOS transistor formed on a second semiconductor layer of a multilayer SOI substrate in which a first insulating layer, a first semiconductor layer, a second insulating layer and the second semiconductor layer are successively formed on a support substrate, and a contact portion for applying a bias voltage to the first semiconductor layer.

Moreover, the present invention provides with a method of manufacturing a semiconductor device, comprising the steps of: (a) forming an element isolating region in a surface semiconductor layer of an SOI substrate in which a buried insulating film and the surface semiconductor layer are formed on a semiconductor substrate or a semiconductor layer; (b) forming in the element isolating region a trench which reaches the semiconductor substrate or the semiconductor layer; (c) forming an insulating film on the whole area of the surface semiconductor layer which includes the trench; (d) etching back the insulating film, thereby forming a side wall spacer on a side wall of the trench and exposing the semiconductor substrate or the semiconductor layer at a bottom of the trench; and (e) burying a conductive film in the trench, thereby forming in the element isolating region a contact portion which is connected to the semiconductor substrate or the semiconductor layer.

PREFERRED EMBODIMENTS OF THE INVENTION

Figure 1A:
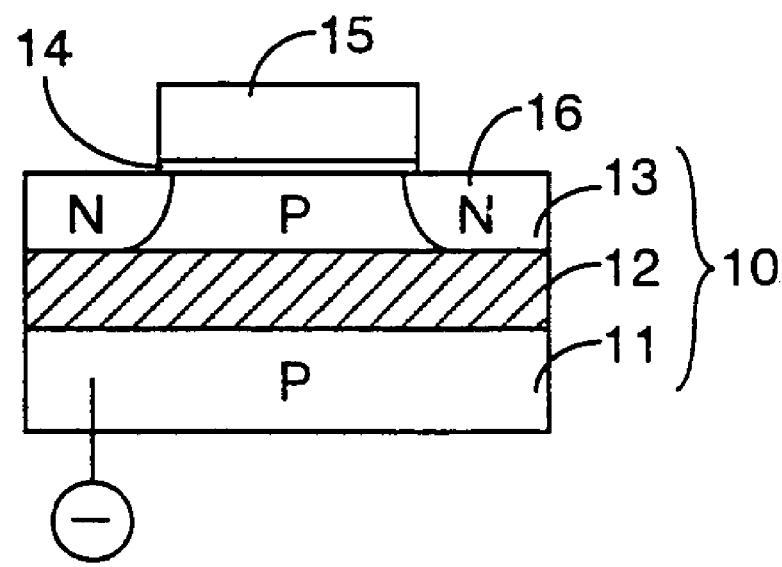
FIGS. 1(a) and 1(b) are plan views of a major part, respectively, for illustrating an example of a semiconductor transistor according to the present invention.

Each of semiconductor devices A and B according to the present invention is so constructed that a PMOS transistor and/or an NMOS transistor of complete depletion type are/is mainly formed on the semiconductor layer of an SOI substrate in which the semiconductor layer is formed on a semiconductor substrate with intervention of a buried insulating film.

Mentioned as such SOI substrates may be a BESOI (Bonded and Etchback SOI) substrate, a SIMOX (Separation by Implantation of OXygen) substrate, etc.

Usable as the semiconductor substrate is any of various substrates, for example, element semiconductor substrates of silicon, germanium, etc. and compound semiconductor substrates of GaAs, InGaAs, etc. Among all, a single-crystal silicon substrate or a polycrystal silicon substrate is favorable, and the single-crystal silicon substrate is especially favorable. The semiconductor substrate may be with a comparatively low resistivity (of, for example, below about 20 Ωcm, and preferably, about 10 Ωcm) by doping with an N-type impurity such as phosphorus or arsenic, or a P-type impurity such as boron. Among all, the semiconductor substrate of P-type is more favorable. Besides, the crystal face orientation of the semiconductor substrate may preferably be (100).

Mentioned as examples of the buried insulating film may be an $SiO_2$ film and an SiN film, in which the $SiO_2$ film is favorable. The thickness of the film can be properly adjusted considering the characteristics of the semiconductor device to be obtained, the level of an applied voltage in the case of using the obtained semiconductor device, and so forth. By way of example, about 50 to about 1000 nm is mentioned as the thickness, and about 500 nm is suitable.

The semiconductor layer is a semiconductor thin film which functions as an active layer for forming the transistor, and which can be formed of any of element semiconductors such as silicon and germanium, compound semiconductors such as GaAs and InGaAs, etc. Among all, a silicon thin film is favorable, and it may be made of a single crystal. The thickness of the semiconductor layer can be properly adjusted when considered from the construction of the semiconductor device to be obtained. By way of example, about 50 to about 1000 nm is mentioned as the thickness, and about 100 to about 500 nm is further mentioned.

In each of the semiconductor devices A and B of the present invention, an active region is defined by forming an element isolating film in the semiconductor layer of the SOI substrate, and the MOS transistor is formed in the active region. In each of the semiconductor devices, a bias voltage is applied to the semiconductor substrate via a contact portion which is formed on the semiconductor substrate. The bias voltage may have a fixed value, or may be changed as appropriate. Among all, it is favorable that bias voltages different from each other are applied to the semiconductor substrate in the operating state and in the standby state of a semiconductor circuit which includes the MOS transistor. Further, the semiconductor devices may have a contact region formed in the active region or the element isolating region or on the side of the semiconductor substrate. Among all, it is favorable that the contact region is formed in the element isolating region. Here, the contact region is for connection with the contact portion, thereby serving to apply the bias voltage to the semiconductor substrate via the contact portion.

The MOS transistor may be either the N-channel MOS transistor or the P-channel MOS transistor, or the MOS transistors may be both the N-channel MOS transistor and the P-channel MOS transistor. Among all, it is favorable that the N-channel MOS transistor and the P-channel MOS transistor are formed on the identical semiconductor layer.

Each of the semiconductor devices A and B of the present invention may be such that, in the part of the semiconductor substrate underlying the MOS transistor formed on the semiconductor layer, a well having an impurity concentration higher than in the other region of the substrate is formed, and that the well is connected to the contact portion. Here, the well may be of the P-type in a case where the MOS transistor is of the N-channel type, and it may be of the N-type in a case where the MOS transistor is of the P-channel type. By the way, in a case where the MOS transistors of both the N-channel type and the P-channel type are formed on the identical semiconductor layer, the P-type well and the N-type well in the semiconductor substrate may be electrically isolated. Also in a case where a plurality of P-type wells or N-type wells are formed, the individual wells may be electrically isolated.

The P-type well to be formed in the semiconductor substrate can be formed by introducing an impurity such as boron, aluminum, gallium or indium, and the N-type well by introducing an impurity such as phosphorus or arsenic. In a case where the conductivity type of the well is opposite to that of the semiconductor substrate, the well is formed by compensating an impurity contained in the semiconductor substrate, and hence, a medium concentration or high concentration is more desirable than a low concentration from the viewpoint of preventing variation in the impurity concentration. Irrespective of the conductivity type of the well, however, the impurity concentration may be, for example, about $10^{17}$ cm$^{-3}$ or below, and more preferably be about $10^{16}$ to $10^{17}$ cm$^{-3}$, in view of implantation damages to the semiconductor layer and the buried insulating film.

The depth of the well can be properly adjusted in accordance with the aspect of the MOS transistor to be formed on this well, the characteristics of the semiconductor device to be finally obtained, and so forth. By way of example, about 0.1 to about 1.0 μm is mentioned as the depth in case of the well opposite in the conductivity type to the semiconductor substrate, and about 0.1 to about 0.5 μm is mentioned in case of the well identical in the conductivity type to the semiconductor substrate.

By way of example, the well can be formed in such a way that, before or after the formation of the element isolating region in the semiconductor layer of the SOI substrate, a mask which has an opening in correspondence with a region to form the well therein is deposited by a known method, for example, by photolithography and etching technique, and that ion implantation is carried out using the mask.

Besides, in a case where the well is connected with the contact portion, a well contact which has the same conductivity type as that of the well and which has an impurity concentration higher than the concentration of the impurity for forming the well may be formed in the surface of the well in order to lower a contact resistance. By way of example, the well contact may be formed in such a way that an impurity identical in the conductivity type to this well is ion-implanted by employing as a mask a resist pattern used in forming the contact portion. Alternatively, the well contact may be formed in such a way that a resist pattern which has an opening in correspondence with a region to form the well contact therein is separately deposited, and that an impurity identical in the conductivity type to this well is ion-implanted by employing the resist pattern as a mask. The impurity concentration of the well contact can be properly adjusted depending upon the impurity concentration of the well, the voltage to be applied to the contact portion, and so forth. By way of example, the impurity concentration may be about $10^{18}$ cm$^{-3}$ or above for the P-type well and about $10^{20}$ cm$^{-3}$ or above for the N-type well. Incidentally, implantation energy for the ion implantation can be properly adjusted depending upon the part of the buried insulating film overlying the region to form the well contact therein, the thickness of the semiconductor layer, and so forth. Mentioned as examples are an energy level of about 100 to about 180 keV in case of employing phosphorus as the impurity, and an energy level of about 80 to about 150 keV in case of employing boron.

Mentioned as examples of a method for isolating the plurality of wells are a method wherein the individual wells are arranged at intervals enough to prevent the wells from being electrically connected when the voltages are applied to the respective wells, and a method wherein an isolating region based on an insulating film is interposed between the adjacent wells. By way of example, a method of forming the isolating region may be any of a method wherein those surface parts of the semiconductor layer, buried insulating film and semiconductor substrate which do not correspond to MOS transistor forming regions are removed, followed by forming the element isolating film, a method wherein a trench which extends from the surface of the semiconductor layer to the interior of the semiconductor substrate is formed, followed by burying the insulating film in the trench, and so forth.

Meanwhile, a semiconductor device C according to the present invention is so constructed that a PMOS transistor and/or an NMOS transistor of complete depletion type are/is mainly formed on the second semiconductor layer of a multilayer SOI substrate in which a first insulating layer, a first semiconductor layer, a second insulating layer and the second semiconductor layer are successively stacked on a support substrate. Herein, a bias voltage is applied to the first semiconductor layer.

The multilayer SOI substrate in the present invention may be any substrate as long as the support substrate, the first insulating layer, the first semiconductor layer, the second insulating layer and the second semiconductor layer are stacked in succession. Mentioned as examples are a SIMOX type substrate wherein a semiconductor substrate is ion-implanted with oxygen and is heat-treated, whereby a buried oxide film as the first insulating layer is formed in the semiconductor substrate; a substrate wherein two semiconductor substrates each of which is formed with an oxide film on its surface by thermal oxidation are bonded together (BESOI substrate); a multilayer SOI substrate of so called "bonded type" wherein a semiconductor substrate whose surface is formed with an oxide film by thermal oxidation, epitaxial growth or the like is bonded to an SOI substrate in which a first insulating layer and a first semiconductor layer are formed on a semiconductor substrate by epitaxial growth; and a multilayer SOI substrate wherein a first insulating film, a first semiconductor layer, a second insulating film and a second semiconductor layer are successively stacked on a semiconductor substrate by epitaxial growth.

Usable as the support substrate is, not only the semiconductor substrate in the SOI substrate mentioned above, but also any of various substrates such as insulating substrates of sapphire, quartz, glass, plastics, etc. Among all, a single-crystal silicon substrate or a polycrystal silicon substrate is favorable, and the single-crystal silicon substrate mentioned above is especially favorable.

Mentioned as the first insulating layer and the second insulating layers are films which are similar to the buried insulating film stated before. Incidentally, the thickness of the second insulating film can be properly adjusted considering the characteristics of the semiconductor device to be obtained, the level of an applied voltage in the case of using the obtained semiconductor device, and so forth. By way of example, about 50 to about 200 nm is mentioned as the thickness, and about 100 nm is suitable.

Usable as the first and second semiconductor layers are semiconductor layers which are similar to those stated before.

In the semiconductor device C of the present invention, an active region is defined by forming an element isolating film in the second semiconductor layer, and the MOS transistor is formed in the active region. The MOS transistor may be any of MOS transistors which are similar to those formed in the SOI substrate stated before.

The bias voltage which is applied to the first semiconductor layer may have a fixed value, or may be changed as appropriate. Among all, it is favorable that bias voltages different from each other are applied to the first semiconductor layer in the operating state and in the standby state of a semiconductor circuit which includes the MOS transistor. The bias voltage is applied to the first semiconductor layer via a contact portion which is formed on the semiconductor substrate. The semiconductor devices may have a contact region formed in the active region or the element isolating region or on the side of the semiconductor substrate. It is favorable that the contact portion is formed in the element isolating region. Here, the contact region is for connection with the contact portion, thereby serving to apply the vias voltage to the first semiconductor layer via the contact portion.

The semiconductor device C of the present invention may be such that, in the surface part of the first semiconductor layer underlying the MOS transistor formed on the second semiconductor layer, a well having an impurity concentration higher than in the other region of the first semiconductor layer is formed, and that the bias voltage is applied to the well. The conductivity type, impurity concentration and depth of the well, a method of and a position for forming the well, the positional relationship of individual wells in the case where the plurality of wells are formed, etc. are as stated before.

In each of the semiconductor devices A to C of the present invention, a method by which the contact portion (and contact region) for applying the bias voltage is formed in the element isolating region may be, for example, a manufacturing method as explained below.

First, at a step (a), an element isolating region is formed in the surface semiconductor layer of an SOI substrate in which a buried insulating film and the surface semiconductor layer are formed on a semiconductor substrate or a semiconductor layer. The "SOI substrate" here may include both a single-layer SOI substrate which is so constructed that the buried insulating film and the surface semiconductor layer are formed on the semiconductor substrate, and a multilayer SOI substrate in which a first insulating layer, a first semiconductor layer (the semiconductor layer), a second insulating layer (the buried insulating film) and a second semiconductor layer (the surface semiconductor layer) are successively stacked on a support substrate, together with any insulating layer and any semiconductor layer if necessary. The element isolating region can be formed by a known method, for example, LOCOS or trench isolation method. An active region can be defined in the surface semiconductor layer by the formation of the element isolating region. By the way, in the case of the single-layer SOI substrate, insofar as the element isolating region is formed in, at least, the surface semiconductor layer, it may well penetrate the buried insulating film or reach even the semiconductor substrate. Besides, in the case of the multilayer SOI substrate, insofar as the element isolating region is formed in, at least, the second semiconductor layer, it may penetrate the second insulating layer or reach even the first semiconductor layer, the first insulating layer or the support substrate.

At a step (b), a trench which reaches the semiconductor substrate or the semiconductor layer is formed in the element isolating region. Mentioned as an example of a method of forming the trench is one wherein a resist pattern which has an opening is deposited on the element isolating region, and wherein the element isolating region, the surface semiconductor layer and the buried insulating film are successively etched by employing the resist pattern as a mask. The size of the trench in this case is not especially restricted as long as it suffices for applying a desired bias voltage to the semiconductor substrate or the semiconductor layer. By the way, in a case where the well has already been formed in the semiconductor substrate or the semiconductor layer, the trench needs to be formed so as to reach this well.

At a step (c), an insulating film is formed on the whole area of the surface semiconductor layer including the trench. Mentioned as the insulating film is, for example, an $SiO_2$ film, an SiN film, or a multilayer film in which the $SiO_2$ and SiN films are stacked. The thickness of the insulating film is not especially restricted as long as it is adapted to fully bury the trench. By way of example, about 200 to about 1500 nm is mentioned as the thickness. Such an insulating film can be formed by a known method such as CVD method.

At a step (d), the insulating film is etched back, thereby to form a side wall spacer on the side wall of the trench and to expose the part of the semiconductor substrate or the semiconductor layer corresponding to the bottom of the trench. The etchback can be performed by, for example, anisotropic etching. Thus, the parts of the insulating film having existed on the surface semiconductor layer and in the bottom of the trench can be removed, so that the semiconductor substrate or the semiconductor layer can be exposed at the bottom of the trench, and that the side wall spacer made of the insulating film can be formed on the side wall of the trench.

At a step (e), a conductive film is buried in the trench, whereby a contact portion connected to the semiconductor substrate or the semiconductor layer is formed in the element isolating region. This step can be implemented, for example, in such a way that the conductive film is first formed on the whole area of the surface semiconductor layer including the trench, and that the part of the conductive film existing on the trench is removed. The material of the conductive film to be formed here, is not especially restricted. By way of example, the conductive film can be formed of a single-layer film or multilayer film made of a metal such as aluminum, copper, gold, silver or platinum; a refractory metal such as tantalum, titanium or tungsten; or polysilicon containing an impurity. The thickness of the conductive film is not especially restricted as long as it is adapted to fully bury the trench. By way of example, about 200 to about 1500 nm is mentioned as the thickness.

Besides, etchback and polishing are mentioned as examples of a method of removing the conductive film existent on the surface semiconductor layer. The etchback can be performed by any of various methods, for example, sputtering, dry etching such as RIE, and wet etching employing a solution which corrodes the conductive film. On the other hand, the polishing includes CMP, CMP employing abrasives, etc. The etchback or polishing in this case may proceed so that the conductive film may be buried only within the trench formed in the element isolating region, and that the surface of the element isolating region may be completely exposed. Thus, the contact portion connected to the semiconductor substrate or the semiconductor layer can be formed in the element isolating region.

By the way, in the method of manufacturing a semiconductor device according to the present invention, the formation of the well in the semiconductor substrate or the semiconductor layer, the formation of a well contact, the introduction of an impurity into the surface semiconductor layer, the formation of a MOS transistor, the formation of an interlayer insulating film, the formation of a contact hole in the interlayer insulating film, the formation of a wiring layer, a heat treatment, etc. may be performed before, during and after the above individual steps as may be needed. Besides, in a case where the contact portion is not formed in the element isolating region, a contact portion can be formed in a desired region in substantially the same way as in the above.

Now, the embodiments of a semiconductor device and a manufacturing method therefor according to the present invention will be described with reference to the drawings.

EMBODIMENT 1

A semiconductor device in this embodiment is such that, as shown in FIG. 1(a), an NMOS transistor is formed on an SOI substrate 10 in which a semiconductor layer 13 made of single-crystal silicon is formed on a silicon substrate 11 of P-type through a buried insulating film 12 made of $SiO_2$. The NMOS transistor is so constructed that a gate electrode 15 is formed on the semiconductor layer 13 doped with an impurity of the P-type, through a gate insulating film 14, and that source/drain regions 16 are formed in those parts of the semiconductor layer 13 which lie outside both the sides of the gate electrode 15. Incidentally, a minus potential is applied to the silicon substrate 11.

Figure 1B:
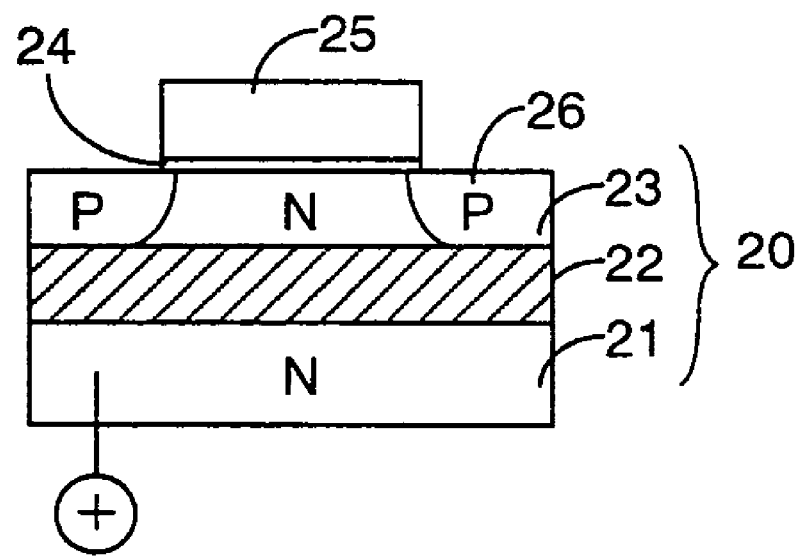

Besides, as shown in FIG. 1(b), a PMOS transistor is formed on an SOI substrate 20 in which a semiconductor layer 23 made of single-crystal silicon is formed on a silicon substrate 21 of N-type through a buried insulating film 22 made of $SiO_2$. The PMOS transistor is so constructed that a gate electrode 25 is formed on the semiconductor layer 23 doped with an impurity of the N-type, through a gate insulating film 24, and that source/drain regions 26 are formed in those parts of the semiconductor layer 23 which lie outside both the sides of the gate electrode 25. Incidentally, a plus potential is applied to the silicon substrate 21.

Owing to such a construction, depletion arises between a channel in each of the MOS transistors and a part underlying the channel, so that a parasitic capacitance can be decreased. As a result, the operating speed of the MOS transistor can be raised.

Figure 2A:
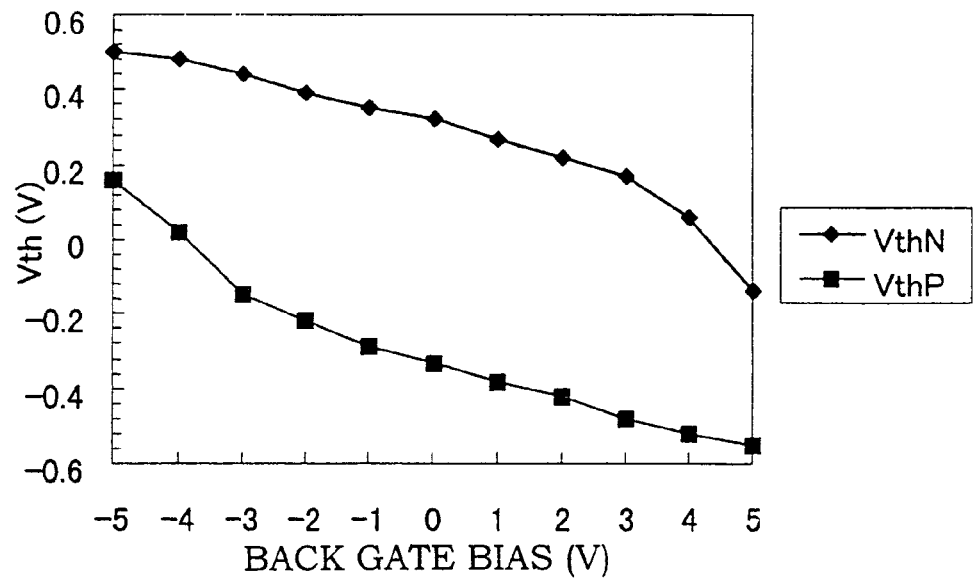
FIGS. 2(a) and 2(b) are graphs showing the relationship between a threshold voltage and a back gate vias voltage of the semiconductor transistor of FIGS. 1(a) and 1(b), and the relationship between an off current and the back gate vias voltage of the semiconductor transistor of FIGS. 1(a) and 1(b), respectively.
Figure 2B:
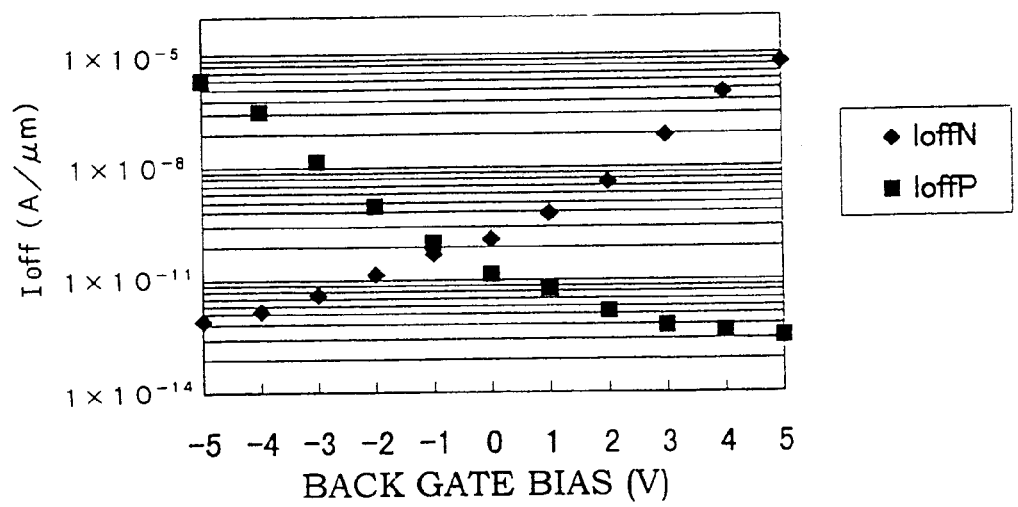

The characteristics of the MOS transistors are shown in FIGS. 2(a) and 2(b). In an example, the L/W values of each of the MOS transistors were 0.35 μm/10 μm.

By way of example, in the NMOS transistor, the substrate bias voltage Vbg of this transistor in the operating mode thereof is set at 3 V, and the substrate bias voltage Vbg thereof in the standby mode thereof is set at −3 V, whereby the threshold voltage Vth of this transistor in the operating mode can be lowered to 0.2 V, and the OFF current Ioff thereof in the standby mode can be lowered to $1 \times 10^{-12}$ A.

Likewise, in the PMOS transistor, the substrate bias voltage Vbg of this transistor in the operating mode thereof is set at −3 V, and the substrate bias voltage Vbg thereof in the standby mode thereof is set at 3 V, whereby the threshold voltage Vth of this transistor in the operating mode can be made −0.2 V, and the OFF current Ioff thereof in the standby mode can be controlled to $1 \times 10^{-12}$ A.

As understood from FIGS. 2(a) and 2(b) in this manner, it is permitted to control the threshold voltage and OFF current of the transistor by changing the bias voltage which is applied to the substrate. As a result, the OFF current in the standby mode can be set lower, and a lower power consumption is realized.

EMBODIMENT 2

Figure 3:
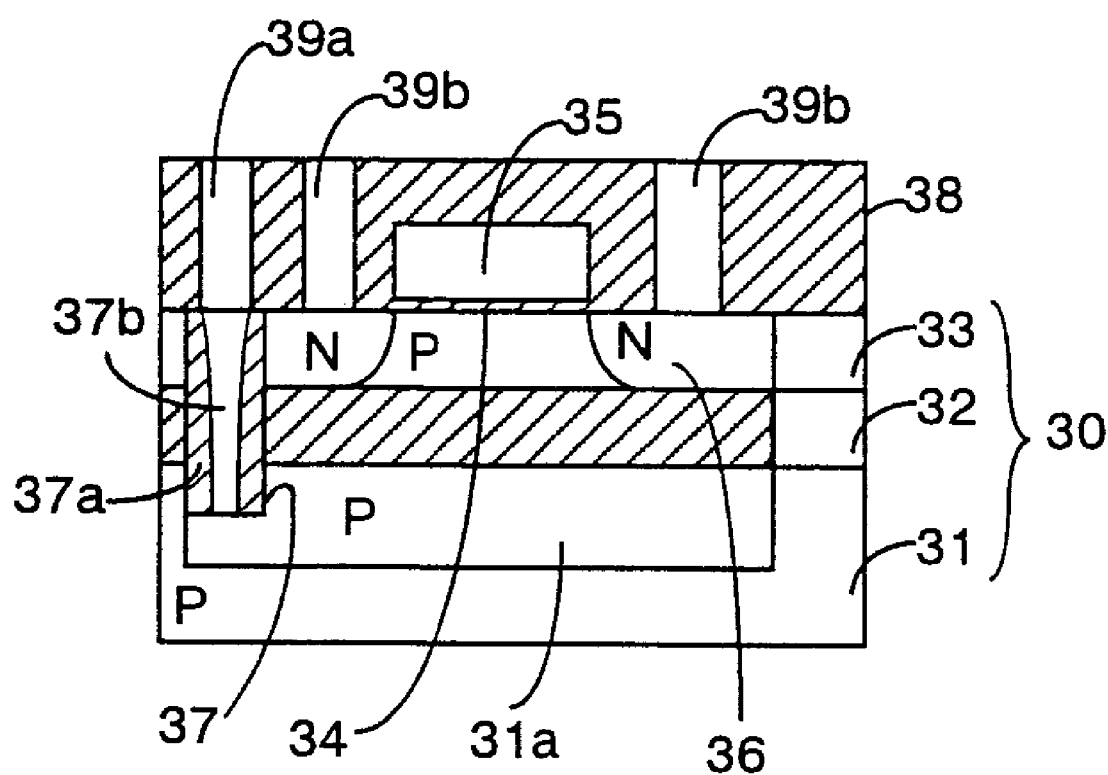
FIG. 3 is a plan view of a major part for illustrating another example of a semiconductor transistor according to the present invention.

As shown in FIG. 3, a semiconductor device in this embodiment is such that, in an SOI substrate 30 (SIMOX substrate) which is constructed of a silicon substrate 31 of P-type (resistivity: about 10 Ωcm), a buried insulating film 32 made of $SiO_2$ and being about 100 nm thick, and a semiconductor layer 33 made of single-crystal silicon and being about 50 nm thick, an NMOS transistor is constructed in which a gate electrode 35 is formed on the semiconductor layer 33 doped with an impurity of the P-type, through a gate insulating film 34, and in which source/drain regions 36 are formed in the parts of the semiconductor layer 33 lying outside both the sides of the gate electrode 35.

Besides, a high-concentration impurity diffusion layer 31a of the P-type is formed in that part of the front surface of the silicon substrate 31 which underlies the NMOS transistor.

Further, an element isolating trench 37, which extends from the front surface of the semiconductor layer 33 to the high-concentration impurity diffusion layer 31a, is formed sideward of the NMOS transistor. A side wall spacer 37a made of an insulating film, and a conductor 37b for a well contact are buried in the element isolating trench 37.

In addition, an insulating film 38 is formed on the NMOS transistor. Those parts of the insulating film 38 which overlie the conductor 37b in the element isolating trench 37 and the NMOS transistor, are respectively formed with a hole 39a for the well contact and contact holes 39b for the transistor. A conductor material is buried in the holes 39a, 39b.

A method of manufacturing a semiconductor device which includes pluralities of NMOS transistors and PMOS transistors, will now be described with reference to FIGS. 4(a) through 4(d) and FIGS. 5(a) through 5(d).

First, an SOI substrate 30 which is constructed of a silicon substrate 31 of P-type, a buried insulating film 32 and a semiconductor layer 33 is prepared, and a resist pattern (not shown) which has openings in regions for forming the PMOS transistors, on the semiconductor layer 33 of the SOI substrate 30, is formed. Using the resist pattern as a mask, phosphorus is ion-implanted into the front surface of the silicon substrate 31 at an implantation energy level of about 180 keV and a dose of about $10^{13}$ $cm^{-2}$, thereby to form N-type wells 31a. Likewise, a P-type well 31b is formed in a region for forming the NMOS transistors, by employing boron (refer to FIG. 4(a)).

Figure 4A:
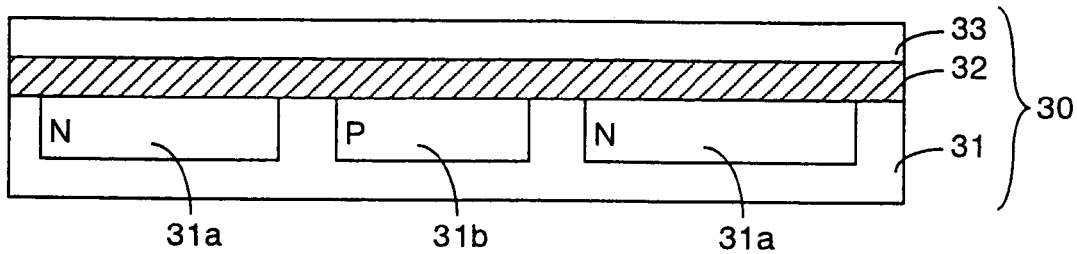
FIGS. 4(a) to 4(d) are schematic sectional views for illustrating an example of a process for manufacturing a semiconductor transistor according to the present invention.
Figure 4B:
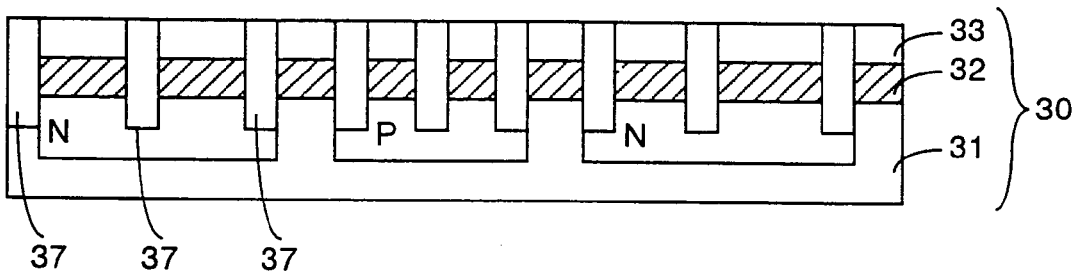

At the next step, as shown in FIG. 4(b), an element isolating trench 37 is formed by a known method, thereby to define the active regions of the individual transistors. The element isolating trench 37 here is formed so as to penetrate the buried insulating film 32. Thus, part of the element isolating trench 37 serves as a well contact formed in the surface of the silicon substrate 31, as will be explained below.

Figure 5A:
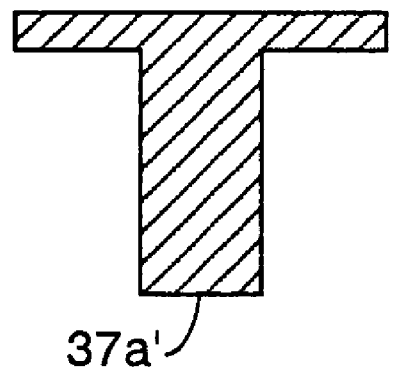
FIGS. 5(a) to 5(d) are schematic sectional views of a major part for illustrating an example of a process for manufacturing the semiconductor transistor of FIGS. 4(a) to 4(d)
Figure 5B:
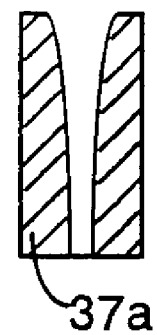
Figure 5C:
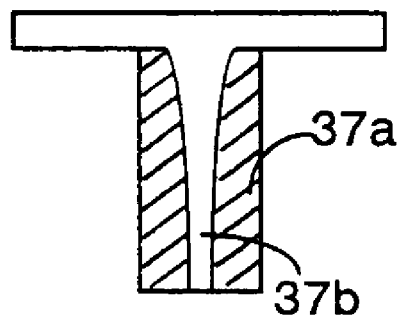
Figure 5D:
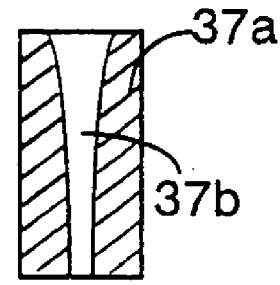
Figure 6A:
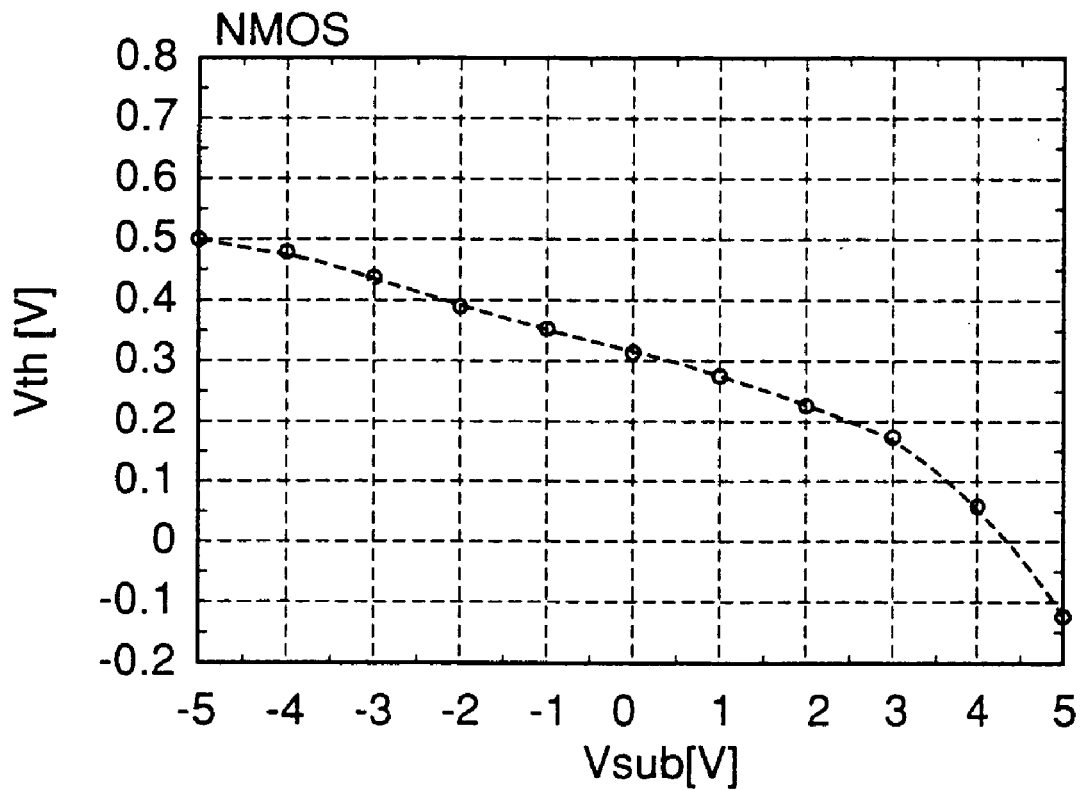
FIGS. 6(a) and 6(b) are graphs showing the relationship between the threshold voltage and the back gate vias voltage of the semiconductor transistor (NMOS transistor) of FIG. 3, and the relationship between the off current and the back gate vias voltage of the semiconductor transistor of FIG. 3, respectively.
Figure 6B:
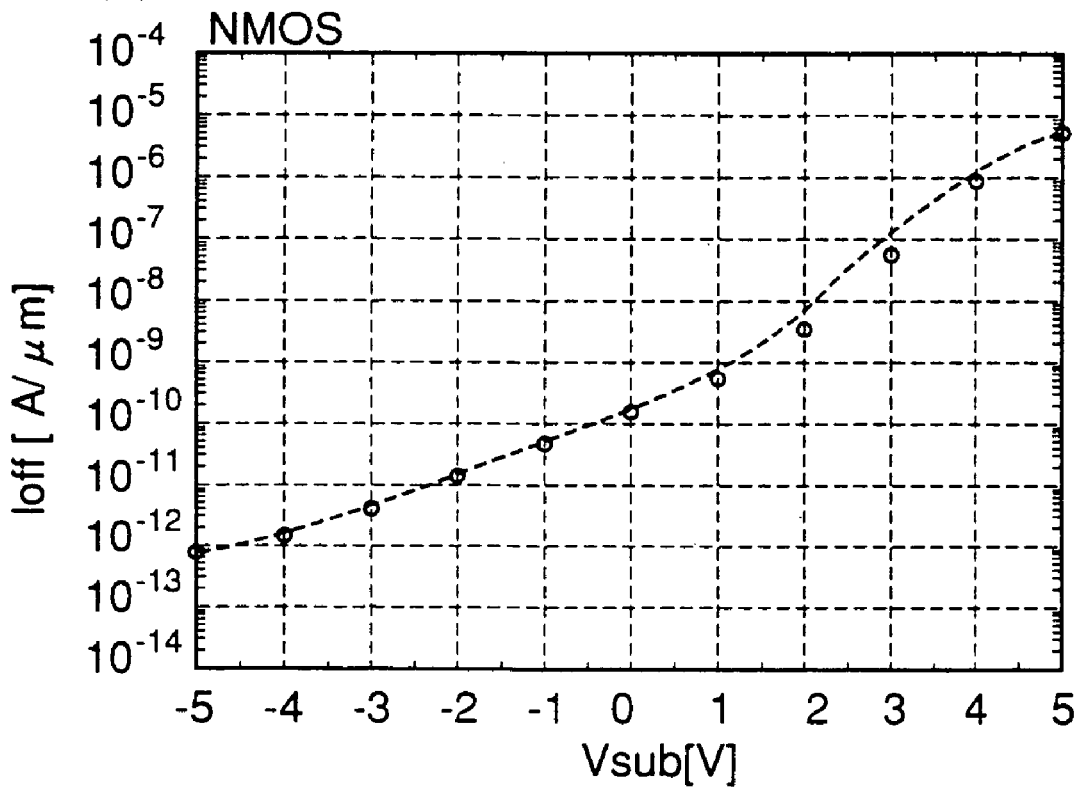
Figure 7A:
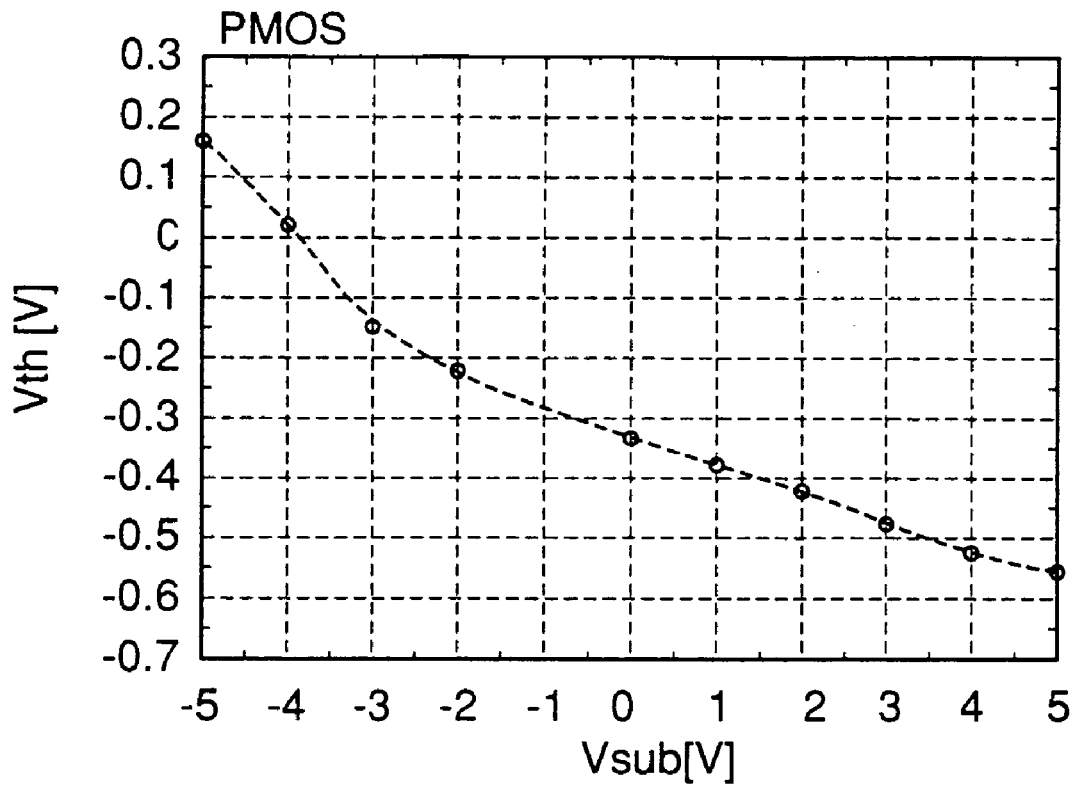
FIGS. 7(a) and 7(b) are graphs showing the relationship between the threshold voltage and the back gate vias voltage of the semiconductor transistor (PMOS transistor) of FIG. 3, and the relationship between the off current and the back gate vias voltage of the semiconductor transistor of FIG. 3, respectively.
Figure 7B:
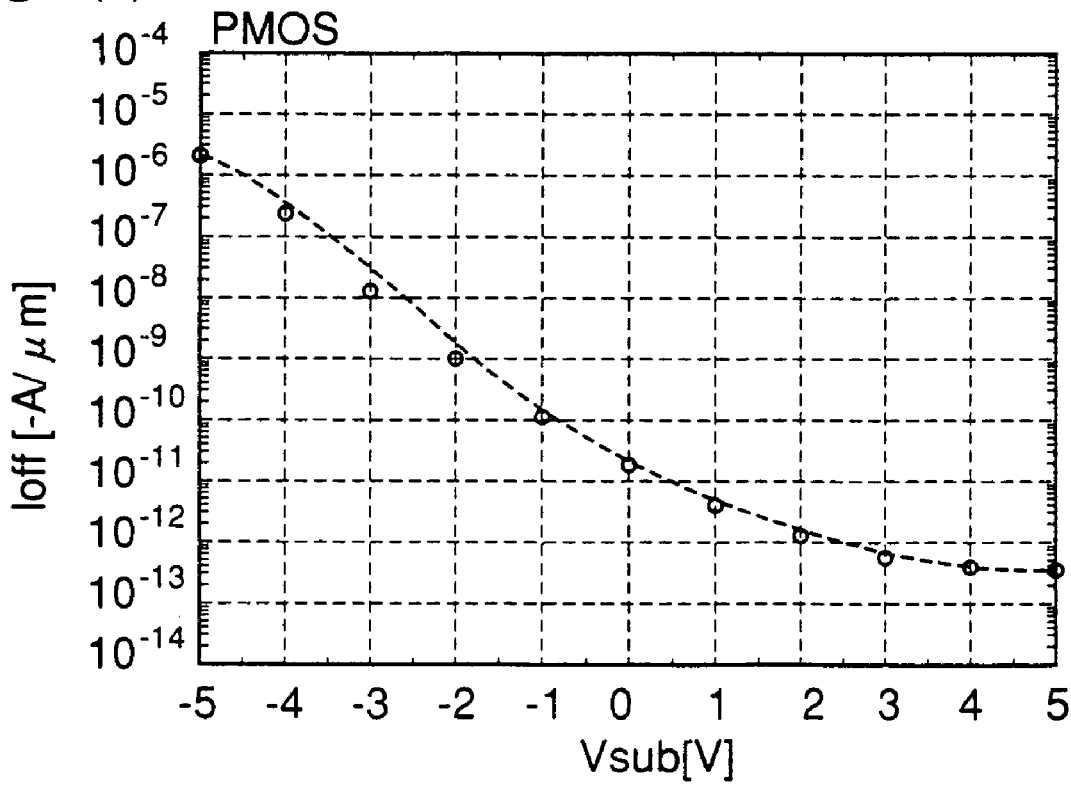

Subsequently, as shown in FIG. 5(a) which is an enlarged view of the element isolating trench 37, this trench 37 is fully buried with a CVD oxide film 37a'. Further, as shown in FIG. 5(b), the CVD oxide film 37a' is etched back, thereby to expose the bottom of the trench 37 and to form a side wall spacer 37a on the side wall of the trench 37. Thereafter, as shown in FIG. 5(c), a film of tungsten or doped polysilicon is deposited as a refractory metal material for establishing the well contact. By the way, in case of employing the doped polysilicon, N-type doped polysilicon is used for the N-type wells 31a, while P-type doped polysilicon is used for the P-type well 31b. Thereafter, as shown in FIG. 5(d), the tungsten film or the doped polysilicon film is etched back to form a conductor 37b for the well contact.

Figure 4C:
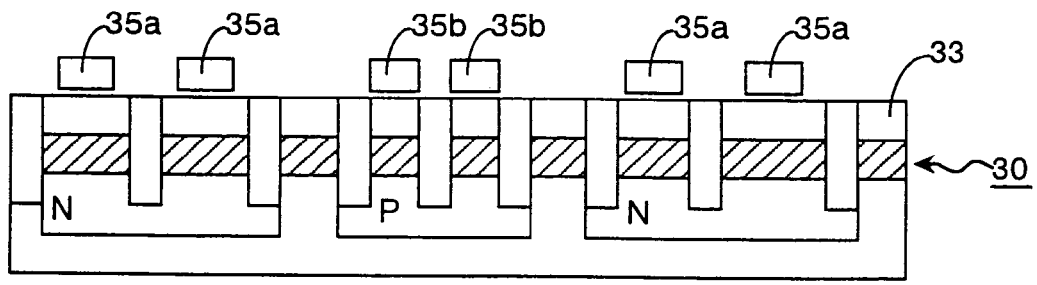
Figure 4D:
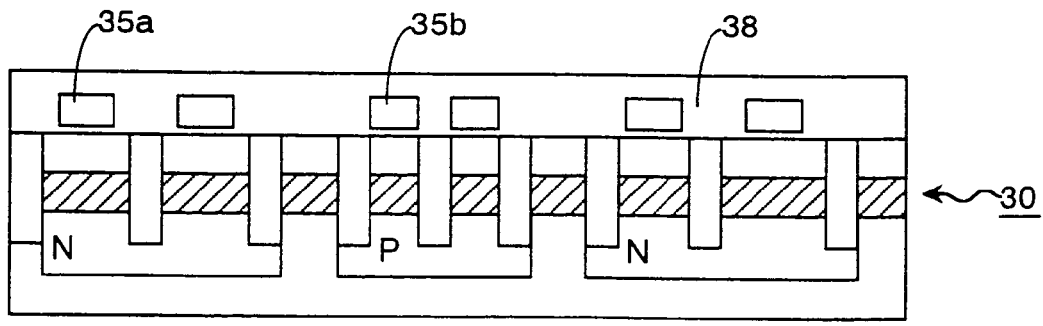

Subsequently, as shown in FIG. 4(c), gate electrodes 35a for the PMOS transistors, gate electrodes 35b for the NMOS transistors, and source/drain regions (not shown) for the PMOS and NMOS transistors are respectively formed on the semiconductor layer 33 of the resulting SOI substrate 30 through gate insulating films. Besides, an insulating film 38 is formed as shown in FIG. 4(d).

Thereafter, a hole 39a for the well contact and ordinary contact holes 39b for the transistors are formed in those parts of the insulating film 38 which lie on the conductor 37b buried in the element isolating trench 37, and a conductor material is buried in the holes 39a, 39b. Thus, a contact portion for applying a bias voltage to the silicon substrate 31 is also finished up.

The transistor characteristics of the MOS transistors are shown in FIGS. 6(a) and 6(b) and FIGS. 7(a) and 7(b). In an example here, the L/W values of each of the MOS transistors were 0.35 µm/10 µm. Besides, drain currents Id and drain voltages Vd in measuring threshold voltages Vth were 0.1 µA/µm and 0.1 V, respectively. Also, gate voltages Vg and drain voltages Vd in measuring OFF currents Ioff were 0 V and 1.5 V, respectively.

As seen from the transistor characteristics, according to the semiconductor device of this embodiment, it is permitted to control the threshold voltages and OFF currents of the transistors formed on the identical well, by changing the bias voltage applied to the substrate. As a result, the OFF current of the semiconductor device in the standby mode thereof can be set low, so that a lower power consumption is realized. Moreover, the element isolating trench is utilized, not only as an element isolating region, but also as the well contact, so that an integrated circuit can be micrified still further.

EMBODIMENT 3

Figure 8A:
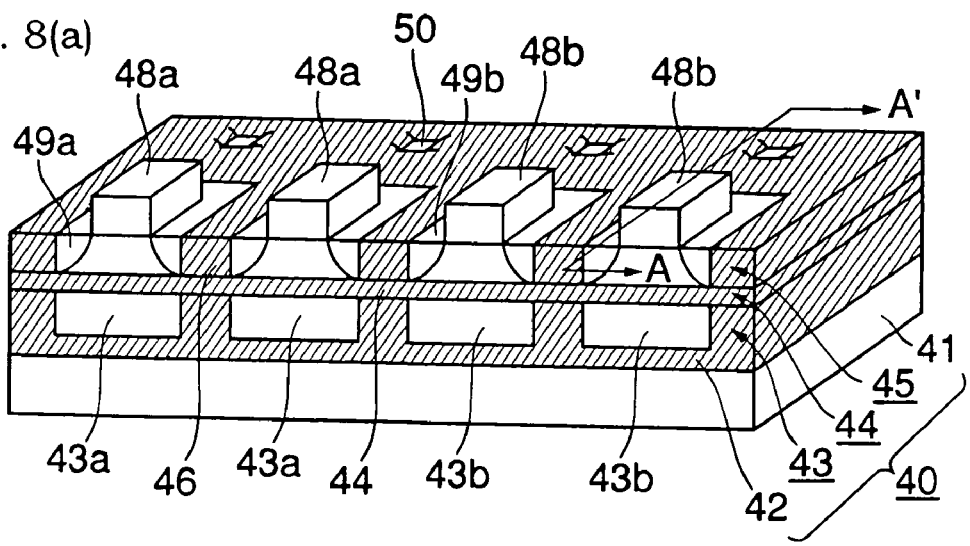
FIGS. 8(a) and 8(b) are a perspective view and a sectional view of a major part, respectively, for illustrating still another example of a semiconductor transistor according to the present invention.
Figure 8B:
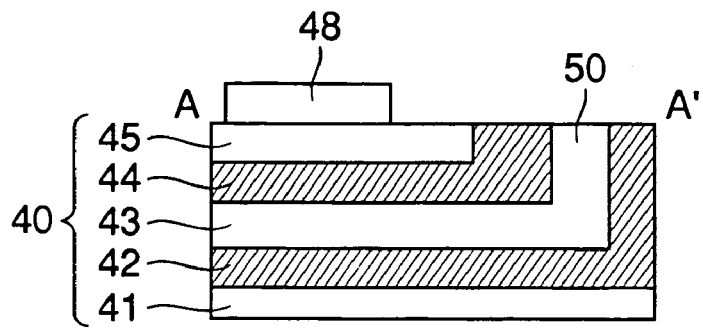

A semiconductor device in this embodiment is formed on a multilayer SOI substrate 40 as shown in FIGS. 8(a) and 8(b).

The multilayer SOI substrate 40 is so constructed that a SIMOX substrate is formed by overlaying a support substrate 41 made of single-crystal silicon, with a first insulating layer 42 made of a silicon oxide film being about 500 nm thick and a first semiconductor layer 43 made of single-crystal silicon being about 200 nm thick, and that a second insulating layer 44 made of a thermal oxide film being about 10 nm thick and a second semiconductor layer 45 made of P-type single-crystal silicon exhibiting a resistivity of 20 Ωcm, having a crystal face orientation of (100) and being about 100 nm thick are further stacked on the SIMOX substrate.

NMOS transistors and PMOS transistors are so constructed that regions for forming the MOS transistors are defined in the second semiconductor layer 45 by a trench element isolating region 46, that gate electrodes 48a, 48b are formed on the defined regions through gate insulating films, and that source/drain regions 49a, 49b are formed in the parts of the second semiconductor layer 45 lying outside both the sides of the gate electrodes 48a, 48b.

By the way, well contacts 50 are formed in the trench element isolating region 46, and they are respectively connected to P-type wells 43a and N-type wells 43b formed in those parts of the first semiconductor layer 43 which lie under the corresponding MOS transistors.

The P-type wells 43a and the N-type wells 43b are respectively isolated in such a way that an element isolating film of which the trench element isolating region 46 is made penetrates the multilayer SOI substrate 40 down to the first insulating film 42.

A method of manufacturing this semiconductor device will be described.

First, in a multilayer SOI substrate 40, those parts of a second semiconductor layer 45, a second insulating layer 44 and a first semiconductor layer 43 which do not correspond to active regions are selectively removed, and an insulating layer is stacked on the resulting structure by employing a known technique, thereby to form a trench element isolating region 46.

Subsequently, a resist pattern (not shown) which has openings in regions for forming PMOS transistors, on the second semiconductor layer 45, is formed by photolithography and etching technique. Using the resist pattern as a mask, phosphorus is ion-implanted into the front surface of the first semiconductor layer 43 at an implantation energy of about 180 keV and a dose of $10^{13}$ cm$^{-2}$, thereby to form N-type wells 43b. Likewise, P-type wells 43a are formed in regions for forming NMOS transistors, by employing boron.

At the next step, the source/drain regions 49a and 49b of the NMOS and PMOS transistors are formed in the second semiconductor layer 45, and the gate electrodes 48a of the NMOS transistors and those 48b of the PMOS transistors are formed on the second semiconductor layer 45 through gate insulating films.

Further, holes for well contacts 50 for changing the potentials of the P-type well 43a and N-type well 43b of the first semiconductor layer 43 are formed, and a conductor material is buried in the well contact holes in the same way as in Embodiment 2, thereby to form the well contacts 50.

In an example, the transistor characteristics of the semiconductor device in this embodiment were similar to those shown in FIGS. 2(a) and 2(b).

As seen from the transistor characteristics, according to the semiconductor device of this embodiment, the threshold voltages and OFF currents of the transistors can be changed to desired values by changing the substrate voltages thereof. Accordingly, the OFF current of the semiconductor device in the standby mode thereof can be set low, and a lower power consumption is realized. Moreover, the wells formed in the first semiconductor layer are completely isolated by the insulating film made of an oxide film or the like, so that the voltages to be applied to the wells can be made different between the adjacent wells at will.

EMBODIMENT 4

Figure 9:
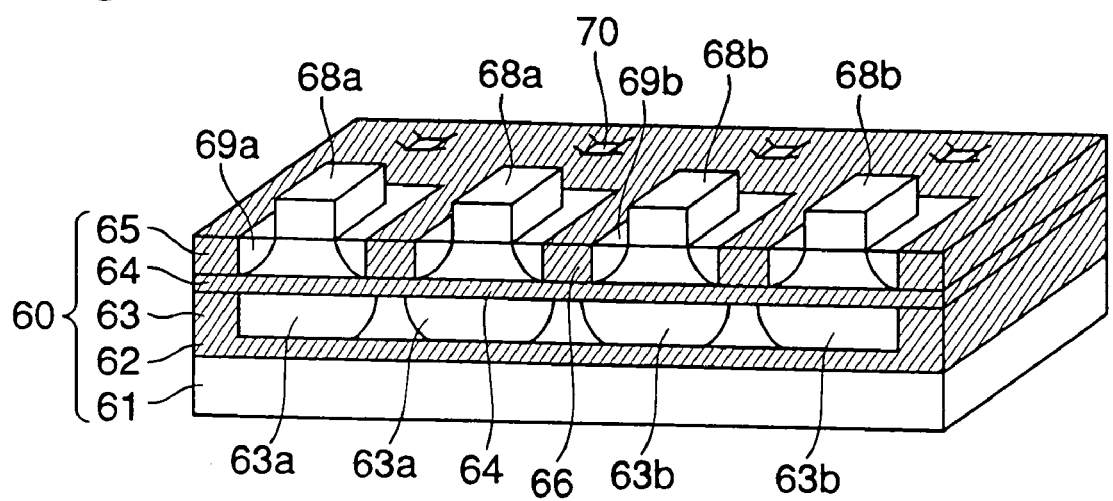
FIG. 9 is a perspective view of a major part for illustrating further example of a semiconductor transistor according to the present invention.
Figure 10:
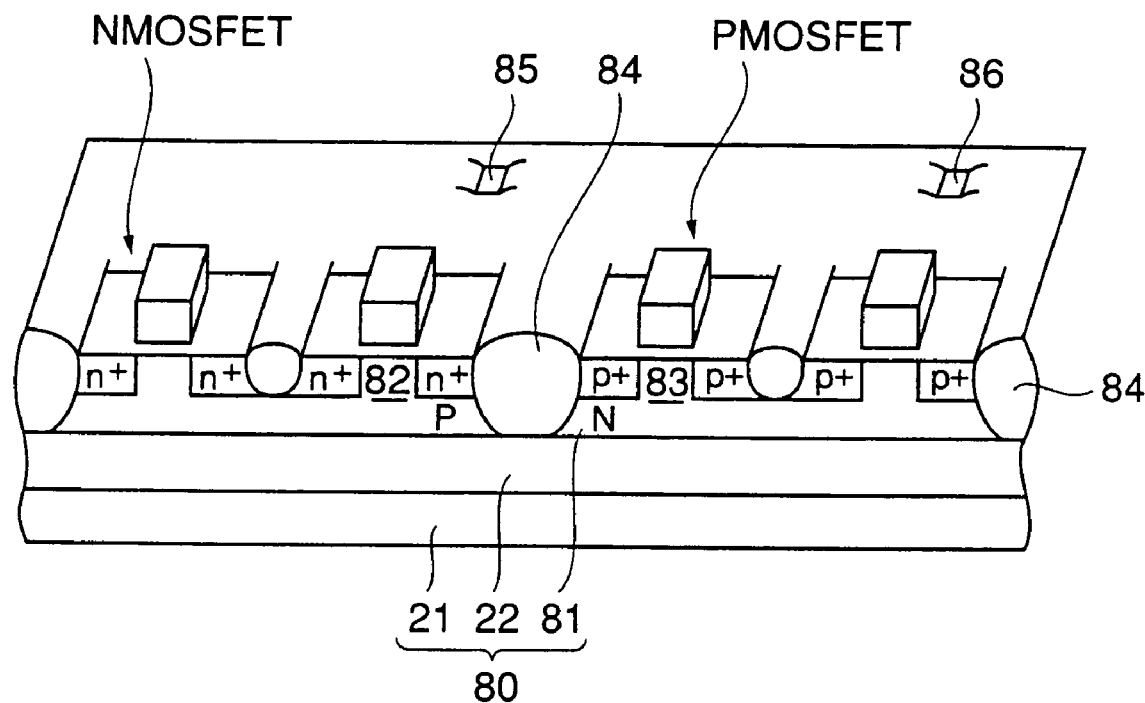
FIG. 10 is a schematic perspective view of a major part for illustrating an example of a semiconductor transistor formed on an SOI substrate according to the prior art.
Figure 11:
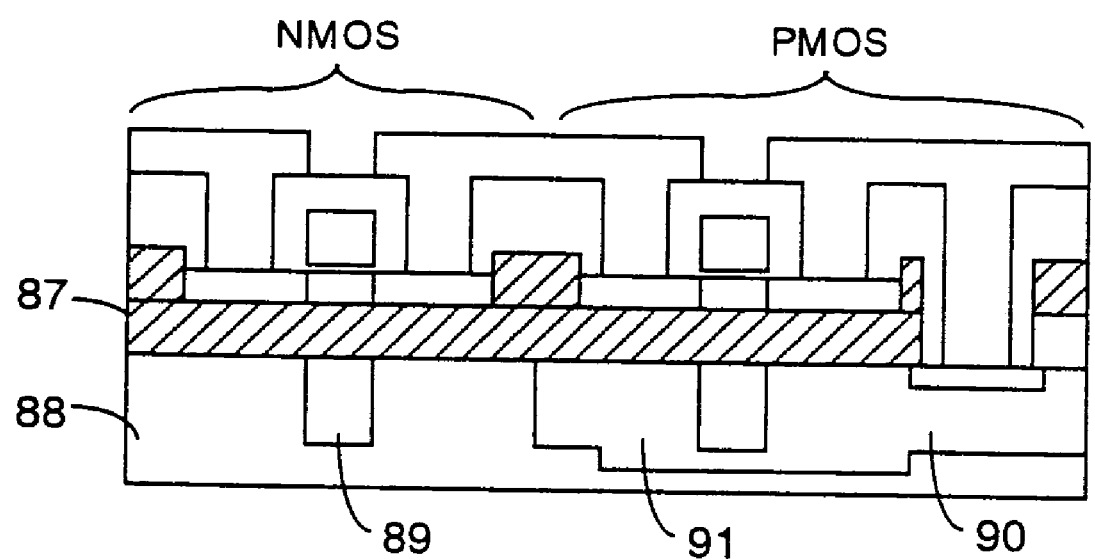
FIG. 11 is a schematic sectional view of a major part for illustrating an example of a semiconductor transistor formed on an SOI substrate according to the prior art.
Figure 12A:
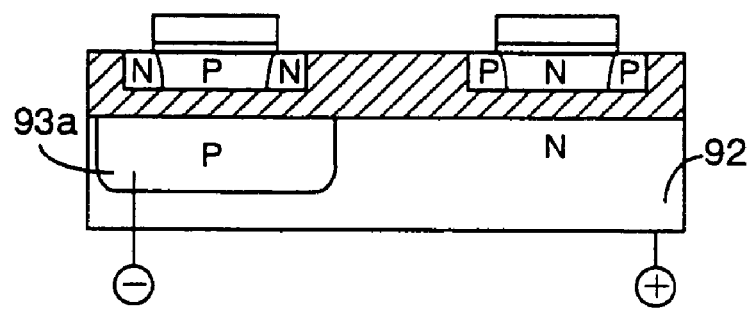
FIGS. 12(a) to 12(d) are schematic sectional views of a major part for illustrating examples of semiconductor transistors formed on an SOI substrate according to the prior art.
Figure 12B:
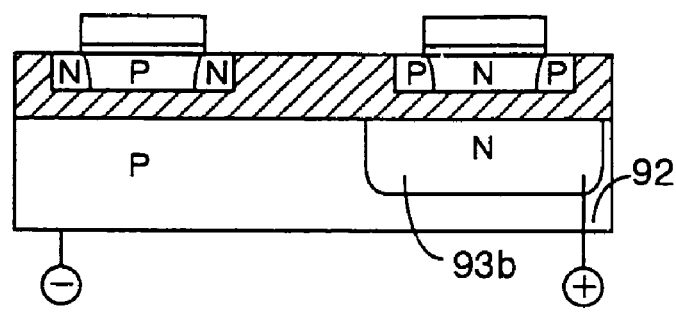
Figure 12C:
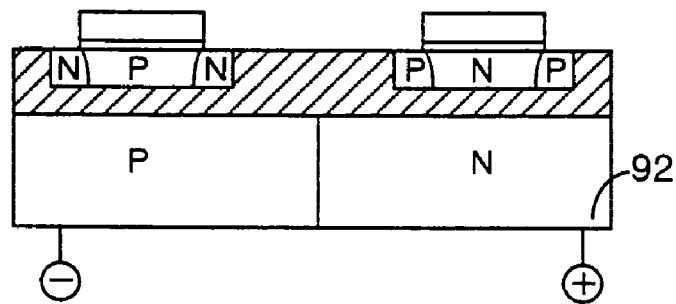
Figure 12D:
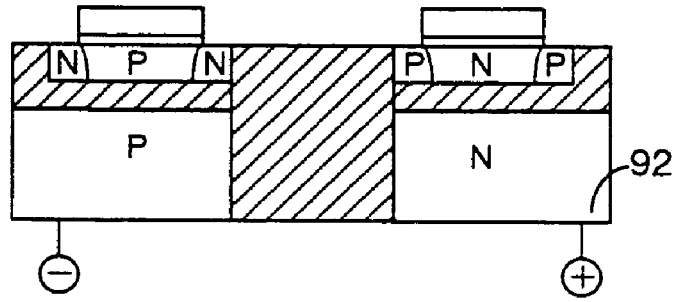
Figure 13:
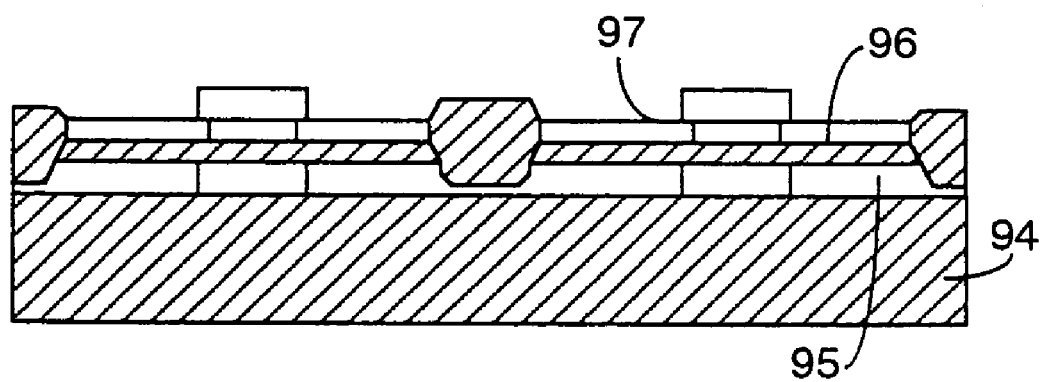
FIG. 13 is a schematic sectional view of a major part for illustrating an example of a semiconductor transistor formed on a dual SOI substrate according to the prior art.

As shown in FIG. 9, a semiconductor device in this embodiment employs a multilayer SOI substrate 60 which has the same construction as in Embodiment 3.

That is, the SOI substrate 60 is constructed by successively stacking a support substrate 61, a first insulating layer 62, a first semiconductor layer 63, a second insulating layer 64 and a second semiconductor layer 65.

A trench element isolating region 66 is formed in the second semiconductor layer 65. NMOS transistors and PMOS transistors are formed of gate electrodes 68a and 68b which are formed on the second semiconductor layer 65 through gate insulating films, and source/drain regions 69a and 69b which are formed in the second semiconductor layer 65.

Incidentally, the element isolating region 66 penetrates only the second insulating layer 64 and does not reach the second semiconductor layer 65. Besides, well contacts 70 are formed in the element isolating region 66, and they are respectively connected to P-type wells 63a and N-type wells 63b formed in those parts of the first semiconductor layer 63 which lie under the corresponding MOS transistors. Further, the P-type wells 63a and the N-type wells 63b are formed so as not to touch within the first semiconductor layer 63 and are electrically isolated from each other.

The semiconductor device can be formed in the same way as in Embodiment 3, except that, in forming the element isolating region 66, those parts of the second semiconductor layer 65 which do not correspond to active regions are selectively removed in the multilayer SOI substrate 60.

In this manner, according to the semiconductor device of this embodiment, the threshold voltages and OFF currents of the transistors can be changed to desired values by changing the substrate voltages thereof. Thus, the OFF current of the semiconductor device in the standby mode thereof can be set low, and a lower power consumption is realized. Moreover, the wells formed in the first semiconductor layer are electrically isolated, so that the voltages to be applied to the wells can be made different between the adjacent wells at will.

According to the present invention, a desired bias voltage is applied to the semiconductor substrate or first semiconductor layer of an SOI substrate as has heretofore been floating or at a ground potential, whereby a consumption current in a standby mode can be lowered. Especially in case of applying bias voltages different from each other in the operating state and standby state of a MOS transistor, an OFF current in the standby state can be set low, so that a lower power consumption is realized, and that the control of the threshold voltages of individual transistors and the suppression of a floating body effect can be satisfactorily achieved.

Besides, in a case where a contact portion for applying the bias voltage to the semiconductor substrate or the first semiconductor layer is formed in an element isolating region, any region for the contact portion need not be separately provided, and it is therefore permitted to cope with micrifying a semiconductor device still further.

Furthermore, in a case where a well is formed in the semiconductor substrate or the first semiconductor layer, it is entirely covered with an insulating film, so that the control of the threshold voltage can be performed precisely. Especially in a case where a well is formed in the first semiconductor layer of a multilayer SOI substrate, the whole areas of the upper surface and lower surface of the well are covered with insulating films, so that the control of the threshold voltage can be performed more precisely. Moreover, in a case where the element isolating region fully covers even the side surface of the well, the control of the threshold voltage can be performed still more precisely.

Also, in a case where a plurality of wells are formed and are electrically isolated from each other, the magnitude of the bias voltage can be controlled every well.

Further, according to a method of manufacturing a semiconductor device in the present invention, a contact portion is formed concurrently with an element isolating region, and hence, the formation of a contact hole for forming the contact portion is done concurrently with that of the element isolating region. It is accordingly possible to manufacture the semiconductor device and curtail the manufactural cost thereof without adding any special troublesome step such as mask step.

What is claimed is:

1. A semiconductor device comprising:
   a multi-layer SOI substrate comprising a first insulating layer, a first semiconductor layer, a buried insulating film, and a second semiconductor layer stacked in this order on a support substrate;
   a first MOS transistor formed on and in the second semiconductor layer of the SOI substrate;
   a contact portion for applying to the first semiconductor layer of the multi-layer SOI substrate different bias voltages in an operating state and a standby state of a semiconductor circuit including the first MOS transistor,
   the first MOS transistor including source and drain regions of a second conductivity type, a channel of the first conductivity type, and wherein an impurity diffusion layer of the first conductivity type is formed in the first semiconductor layer of the multi-layer SOI substrate under at least the entire source, drain and channel regions, so that the impurity diffusion layer is of the same conductivity type as the first semiconductor layer of the multi-layer SOI substrate, wherein said source and drain regions as well as said channel are all formed in the second semiconductor layer of the multi-layer SOI substrate;
   wherein the contact portion for applying the different bias voltages is formed in a device isolation region and comprises a contact hole in the second semiconductor layer and the buried insulating film, said contact hole reaching the impurity diffusion layer so that the different bias voltages are applied to the SOI substrate via the impurity diffusion layer, and wherein a conductor of the contact portion in the contact hole is electrically insulated from the second semiconductor layer by at least said device isolation region which includes at least one insulator;
   a second MOS transistor, wherein the first and second MOS transistors are of different conductivity types on the SOI substrate and are adjacent each other, and wherein bias voltages applied via said contact portion for the first transistor and a contact portion for the second transistor are changed between the active and standby states so that active regions of the first and second transistors are substantially completely depleted in the standby state; and
   wherein the first MOS transistor comprises a P-type well and the second MOS transistor comprises an N-type well formed in the first semiconductor layer of the multi-layer SOI substrate, and wherein the P-type well of the first MOS transistor and the N-type well of the second MOS transistor are substantially electrically isolated from each other, and wherein the impurity diffusion layer makes up at least part of the P-type well of the first MOS transistor.

2. A semiconductor device according to claim 1, wherein the impurity diffusion region is formed as a well in a surface of the first semiconductor layer of the multi-layer SOI substrate which lies under the first MOS transistor, the well having an impurity concentration higher than that of the other region of the first semiconductor layer.

3. A semiconductor device according to claim 2, wherein the well is a P-type well under an N-channel MOS transistor which is the first of said first and second MOS transistors, while a well for the other of the first and second MOS transistors is an N-type well formed in the first semiconductor layer under a P-channel MOS transistor which is the second of said first and second MOS transistors.

4. A semiconductor device comprising:
   a multi-layer SOI substrate comprising a first insulating layer, a first semiconductor layer, a buried insulating film, and a second semiconductor layer stacked in this order on a support substrate;
   a first MOS transistor formed on and in the second semiconductor layer of the multi-layer SOI substrate,
   an element isolating region formed in the second semiconductor layer,
   a contact region formed in the element isolating region for connection with a contact portion for applying a bias voltage to a well of the first semiconductor layer of the multi-layer SOI substrate for the first MOS transistor, the well being of the first conductivity type same as that of the other region of the first semiconductor layer of the multi-layer SOI substrate directly under the well;
   wherein a conductor of the contact portion in the contact region is electrically insulated from said second semiconductor layer;
   a second MOS transistor, wherein the first and second MOS transistors are of different conductivity types on the SOI substrate, and wherein bias voltages applied via said contact portion for the first transistor and a separate contact region including a contact portion for the second transistor are changed between the active and standby states so that active regions of the first and second transistors are substantially completely depleted in the standby state; and wherein the first MOS transistor comprises a P-type well and the second MOS transistor comprises a N-type well formed in the first semiconductor layer of the multi-layer SOI substrate, and wherein the P-type well of the first MOS transistor and the N-type well of the second MOS transistor are substantially electrically isolated from each other.

5. A semiconductor device according to claim 4, wherein the well is formed in a surface of the first semiconductor layer under the first MOS transistor formed on the second semiconductor layer, the well having an impurity concentration higher than that of the other region of the first semiconductor layer.

6. A semiconductor device according to claim 5, wherein the well is a P-type well under an N-channel MOS transistor which is the first of said first and second MOS transistors, while a well for the other of the first and second MOS transistors is an N-type well formed in the first semiconductor layer of the multi-layer SOI substrate under a P-channel MOS transistor which is the second of said first and second MOS transistors.

7. A semiconductor device according to claim 4, wherein different values of said bias voltages are applied in an operating state and a standby state of a semiconductor circuit including the at least the first MOS transistor, thereby to change a threshold voltage of at least the first MOS transistor.

8. A semiconductor device comprising:
a multi-layer SOI substrate comprising a first insulating layer, a first semiconductor layer of a first conductivity type, a buried insulating film, and a second semiconductor layer stacked in this order;
a PMOS transistor and an NMOS transistor formed on and in the second semiconductor layer of the SOI substrate,
a p-type well formed in the first semiconductor layer of the SOI substrate for the NMOS transistor and an n-type well formed in the first semiconductor layer of the SOI substrate for the PMOS transistor, the p-type and n-type wells being substantially isolated from one another; and
respective contact portions for applying to the first semiconductor layer of the multi-layer SOI substrate via the wells different bias voltages in a transistor operating state and a transistor standby state so that active regions of the different conductivity type transistors are substantially completely depleted in the standby state, wherein said contact portions are electrically insulated from said second semiconductor layer.

* * * * *